United States Patent
Tuda et al.

[11] Patent Number: 6,054,016
[45] Date of Patent: Apr. 25, 2000

[54] MAGNETICALLY ENHANCED MICROWAVE PLASMA GENERATING APPARATUS

[75] Inventors: Mutumi Tuda; Kouichi Ono; Masaaki Tsuchihashi; Minoru Hanazaki; Toshio Komemura; Kouji Oku; Shinji Nakaguma, all of Tokyo, Japan

[73] Assignees: Mitsubishi Denki Kabushiki Kaisha; Mitsubishi Electric Engineering Co., Ltd., both of Tokyo, Japan

[21] Appl. No.: 09/031,706

[22] Filed: Feb. 27, 1998

[30] Foreign Application Priority Data

Sep. 26, 1997 [JP] Japan ................................ 9-262047

[51] Int. Cl.[7] .............................. C23F 1/02; C23C 16/00
[52] U.S. Cl. ................................... 156/345; 118/723 MR
[58] Field of Search ..................... 204/298.38, 298.37; 156/345; 118/723 MW, 723 MA, 723 ME, 723 MR, 723 AN

[56] References Cited

U.S. PATENT DOCUMENTS

| | | | |
|---|---|---|---|
| 4,265,730 | 5/1981 | Hirose et al. | 204/298.38 |
| 4,831,963 | 5/1989 | Saito et al. | 204/298.38 |
| 4,893,584 | 1/1990 | Doehler et al. | 156/345 |
| 4,960,073 | 10/1990 | Suzuki et al. | 204/298.37 |
| 5,022,961 | 6/1991 | Izumi et al. | 156/345 |
| 5,266,146 | 11/1993 | Ohno et al. | 204/298.38 |
| 5,306,985 | 4/1994 | Berry | 204/298.38 |
| 5,387,288 | 2/1995 | Shates | 118/723 AN |
| 5,429,070 | 7/1995 | Campbell et al. | 204/298.38 |
| 5,749,966 | 5/1998 | Shates | 118/723 MW |

OTHER PUBLICATIONS

M. Nagatsu et al., "Optical Emission and Microwave Field Intensity Measurements in Surface Wave–Excited Planar Plasma", Jpn. J. Appl. Phys. vol. 35, Part 2, No. 3A, Mar. 1996, pp. L341–L344.

Primary Examiner—Nam Nguyen
Assistant Examiner—Gregg Cantelmo
Attorney, Agent, or Firm—McDermott, Will & Emery

[57] ABSTRACT

There is provided a plasma generating apparatus comprising: a waveguide for guiding a microwave; a vacuum vessel connected to the waveguide, having a means for supplying a gas for discharging electrons and a means for evacuating; and a dielectric member in a tube-like shape or a rod-like shape which is inserted in the vacuum vessel, wherein the dielectric member is provided with a means for emitting the microwave, whereby it is possible to apply the electric power of microwave effectively to plasma of high density exceeding so-called cut-off density and to homogenize the distribution of plasma in the vacuum vessel.

9 Claims, 7 Drawing Sheets

MAGNETICALLY ENHANCED MICROWAVE PLASMA GENERATING APPARATUS

BACKGROUND OF THE INVENTION

1. Field of the Invention

The present invention relates to a plasma generating apparatus for generating Low-pressure, Low-temperature plasmas in a vacuum vessel, particularly, to the apparatus which is used for surface treatment, etching, ashing, cleaning, depositing a thin film and so on on a semiconductor substrate, a liquid crystal substrate, an organic material, a metallic material, or the like by using the generated plasma.

2. Discussion of Background

Hereinbelow, a conventional and representative plasma generating apparatus using a microwave, which can generate plasma by an electromagnetic energy of a surface wave exited and transmitted at the boundary between the plasma and a surface of dielectric material used for introducing the microwave into a vacuum vessel, will be described.

In FIG. 8, there is shown a schematical structure of a surface wave plasma generating apparatus, for example, which is described in Japanese Journal of Applied Physics, Vol. 35, (1996), p.L341–L344. In FIG. 8, numeral 1 designates a vacuum vessel in which a gas supply port 1a and an evacuation port 1b are respectively formed in the side portions thereof. Numeral 2 designates a microwave oscillator for oscillating microwave; numeral 3 designates a power source for driving the microwave oscillator 2; numeral 4 designates a dielectric plate made of a dielectric material through which microwave is permeable, which plate is disposed in a side wall of the vacuum vessel 1 and separates the vacuum atmosphere from the atmosphere; and numeral 5 designates a waveguide for guiding the microwave oscillated in the microwave oscillator 2 to the dielectric plate 4, which connects the dielectric plate 4 to the microwave oscillator 2. Numeral 6 designates a slit provided in the bottom surface of the microwave guide 5, which is in contact with the dielectric plate 4; and numeral 7 designates a substrate to be treated which is subjected to various surface treatment using the plasma generating apparatus.

The operation of the conventional surface wave plasma generating apparatus constituted as in the above is described. The inside of vacuum vessel 1 was evacuated to obtain a high vacuum by a high vacuum pump (now shown) such as a roughing pump and a turbo-molecule-pump. A gas for discharging electrons (discharge gas), for example, argon, hydrogen, oxygen, chlorine, carbon tetrafluoride, and silane, was supplied through the gas supply port 1a until the inside of vacuum vessel 1 has a predetermined pressure by the gas. A microwave oscillated by the microwave oscillator 2 was introduced through the waveguide 5 and emitted from the slit 6 provided in the bottom surface of the waveguide 5. The emitted microwave was introduced into the vacuum vessel 1 through the dielectric plate 4, whereby plasma 8 of the discharge gas was generated in the vacuum vessel.

It is known that when once the plasma 8 was generated, the microwave introduced into the vacuum vessel 1 became a surface wave which can transmit along with only the boundary between the dielectric plate 4 and the plasma, and that even in a case of high density plasma 8 having an electron density therein exceeding a so-called cut-off density (for example, about $7 \times 10^{10} cm^{-3}$ in case of a microwave having a frequency of 2.45 GHz), the exited surface wave was transmitted and absorbed without being reflected. Thus, an electron of the plasma 8 in the vicinity of the dielectric plate 4 was accelerated by a vibrational electric field of the surface wave to thereby change in a high-energy-state. A neutral gas particle in a form of atom or in a form of molecule was exited, dissociated and ionized by the high-energy electron to maintain the generation of plasma 8. Therefore, it was convenient for the generation of the plasma of a high density exceeding the cut off density to couple the plasma 8 with the microwave power to be supplied in the form of surface wave.

However, the conventional surface wave plasma generating apparatus has problems that the electric field strength of microwave in the surface area of the flat dielectric plate 4; and the distribution of microwave electric field strength is in the direction of diameter and the direction of circumference of the surface area of the dielectric plate 4 depending on conditions of generating plasma, such as a gas pressure and an electric power of microwave. As the result of inhomogeneous electric field strength, the distribution of the density of electrons and ions existing in the generated plasma 8 in the diameter direction and the circumference direction in the vacuum vessel 1 became inhomogeneous.

Further, the electrons and the ions in the generated plasma 8 inject into the inner surface of vacuum vessel 1 or the inner surface of the dielectric plate 4, and thereafter extinct immediately by a combination process. Therefore, in order to maintain the generation of the plasma 8, ionization, namely the generation of plasma, sufficient to compensate the loss of plasma caused by the recombination in the wall surface was necessary. However, in the conventional plasma generating apparatus, the rate of loss of plasma in the wall surface was large because an effect of confining electrons and ions did not exist. Accordingly, in the conventional surface wave plasma generating apparatus, there were problems that the plasma was hard to catch fire; the plasma was difficult to be generated; and the maintenance of generation of the plasma was difficult.

SUMMARY OF THE INVENTION

The present invention is to solve the above mention problems inherent in the prior art.

It is an object of the present invention to provide a plasma generating apparatus capable of generating and maintaining a high density plasma in a homogeneous distribution in the diameter direction and the circumference direction of the vacuum vessel.

It is also an object of the present invention to provide a plasma generating apparatus capable of making a distribution of plasma in a vacuum vessel more homogeneous and of generating and maintaining plasma stably even under a low gas pressure.

According to a first aspect of the present invention, there is provided a plasma generating apparatus comprising: a waveguide for guiding a microwave; a vacuum vessel connected to the waveguide, having a means for supplying a gas for discharging electrons and a means for evacuating; and a dielectric member in a tube-like shape or a rod-like shape, which is inserted in the vacuum vessel, characterized by the dielectric member is provided with a means for emitting microwave.

According to a second aspect of the present invention, there is provided the plasma generating apparatus according to the first aspect of the invention, wherein a means for generating a magnetic field is provided in the outer portion of the vacuum vessel.

According to a third aspect of the present invention, there is provided the plasma generating apparatus according to the first aspect of the invention, wherein the means for emitting microwave is a slit or an antenna provided in a wall of the waveguide.

According to a fourth aspect of the present invention, there is provided the plasma generating apparatus according to the first aspect of the invention, wherein the dielectric member is a high molecular material, such as quartz, Pyrex™ glass and Teflon™ (polytetrafluoroethylene), a ceramic, or a combination of the high molecular materials and the ceramic, through which a microwave is permeable.

According to a fifth aspect the present invention, there is provided the plasma generating apparatus according to the second aspect of the invention, wherein the dielectric member is located in a weak magnetic field region having a magnetic field strength of 100 G or less.

According to a sixth aspect the present invention, there is provided the plasma generating apparatus according to the second aspect of the invention, wherein the means for emitting microwave is located in a weak magnetic field region having a magnetic field strength of 100 G or less.

According to a seventh aspect the present invention, there is provided the plasma generating apparatus according to the second aspect of the invention, wherein, in the vacuum vessel, a magnetic field strength sufficient for causing an electron cyclotron resonance is generated; and a discharge is started using the electron cyclotron resonance.

According to an eighth aspect the present invention, there is provided the plasma generating apparatus according to the second aspect of the invention, wherein the means for generating magnetic field is a permanent magnet.

According to a ninth aspect the present invention, there is provided the plasma generating apparatus according to the second aspect of the invention, wherein an electromagnetic coil for generating a component of magnetic field to be superposed on the component of magnetic field of the means for generating magnetic field is provided in the outside of the vacuum vessel.

BRIEF DESCRIPTION OF THE DRAWINGS

A more complete application of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
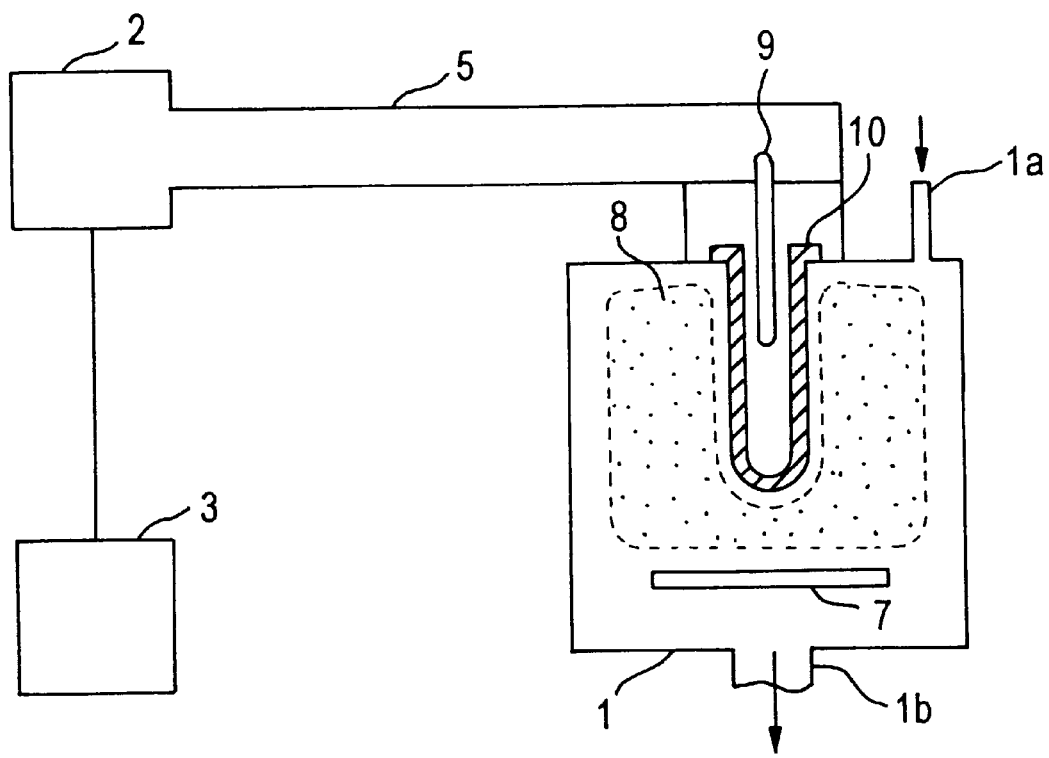
FIG. 1 is schematical view for showing the structure of an example of plasma generating apparatus according to the present invention.

A detailed explanation will be given of a preferred embodiment of the present invention in reference to FIGS. 1 through 7 as follows, wherein the same reference numerals are used for the same or the similar portions and description of these portions is omitted.

EXAMPLE

FIG. 1 is a schematical view for showing the structure of an example of plasma generating apparatus according to the present invention. In FIG. 1, reference numeral 1 designates a vacuum vessel in which a gas supply port 1a and an evacuation port 1b are respectively formed in the side portions thereof. Numeral 2 designates a microwave oscillator for generating a microwave; numeral 3 designates a power supply for driving the microwave oscillator 2; numeral 5 designates a waveguide; numeral 7 designates a substrate subject to various surface treatment; numeral 8 designates plasma; and numeral 9 designates a means for emitting microwave which is connected to the waveguide 5 and provides the electric power of the microwave from a microwave transmission circuit, wherein it is shown as a rod antenna in the Figures. Numeral 10 designates a cylindrical dielectric tube made of a dielectric member for separating the vacuum atmosphere from the atmosphere and for introducing the microwave into the vacuum vessel 1, where a dielectic material, such as quartz, alumina and teflon, through which a microwave is permeable, or a combination of the dielectric materials can be used for the dielectric tube.

Hereinbelow, an operation of the plasma generating apparatus according to the example of the present invention constructed as in the above is explained.

At first, the vacuum vessel 1 is evacuated to be a high-vacuum using a roughing pump and/or a high vacuum pump (not shown) such as a turbomolecular pump, which is connected to the evacuation port 1b as in the conventional apparatus. A gas for discharging electrons (discharge gas) such as argon, hydrogen, oxygen, chlorine, carbon-tetrafluoride, silane, and so on is supplied through the gas supply port 1a. When the inner pressure of the vacuum vessel 1 reaches to a predetermined pressure by the discharge gas, a microwave is emitted to the dielectric tube 10 by the rod antenna 9 through the waveguide 5 thereby to supply the electric power of microwave. The emitted microwave is introduced into the vacuum vessel 1 through the dielectric tube 10 which is inserted into the vacuum vessel 1.

The dielectric tube 10 also works to separate the vacuum atmosphere from the atmosphere and to introduce the microwave into the inside of vacuum vessel. Further, after once the plasma is generated in the vacuum vessel 1, a surface wave can be excited and transmitted along with the boundary between the dielectric tube 10 and the plasma; it is possible to apply the electric power of microwave to a plasma high enough to exceed a cut-off density and to obtain a homogeneous distribution of the plasma in the vacuum vessel 1.

Figure 2:
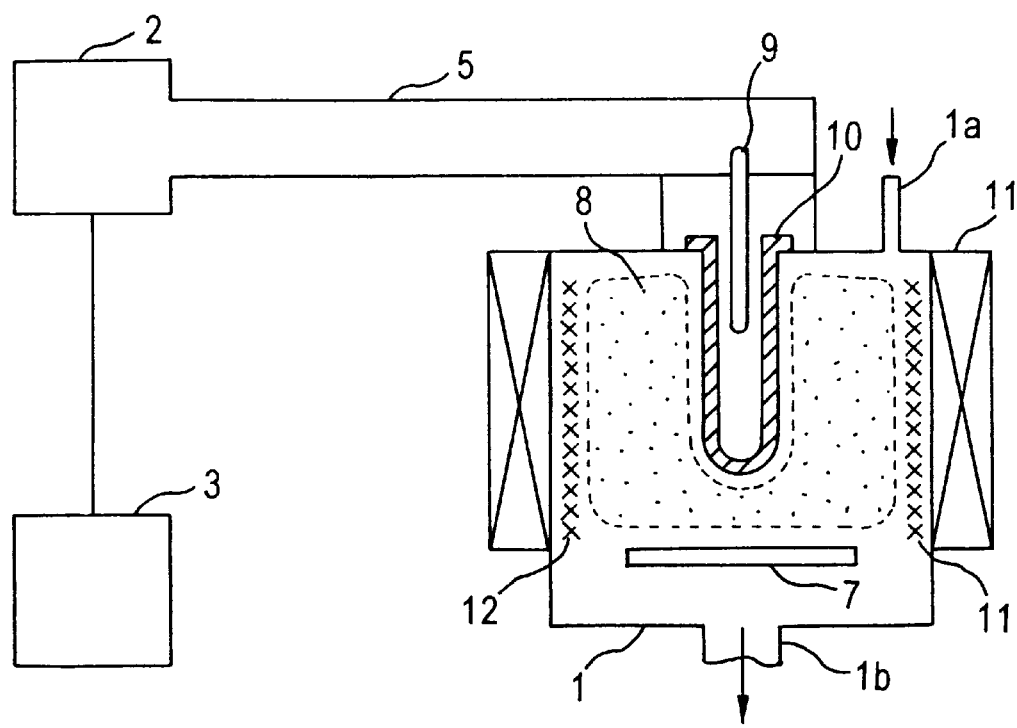
FIG. 2 is schematical view for showing the structure of another example of plasma generating apparatus according to the present invention.
Figure 3:
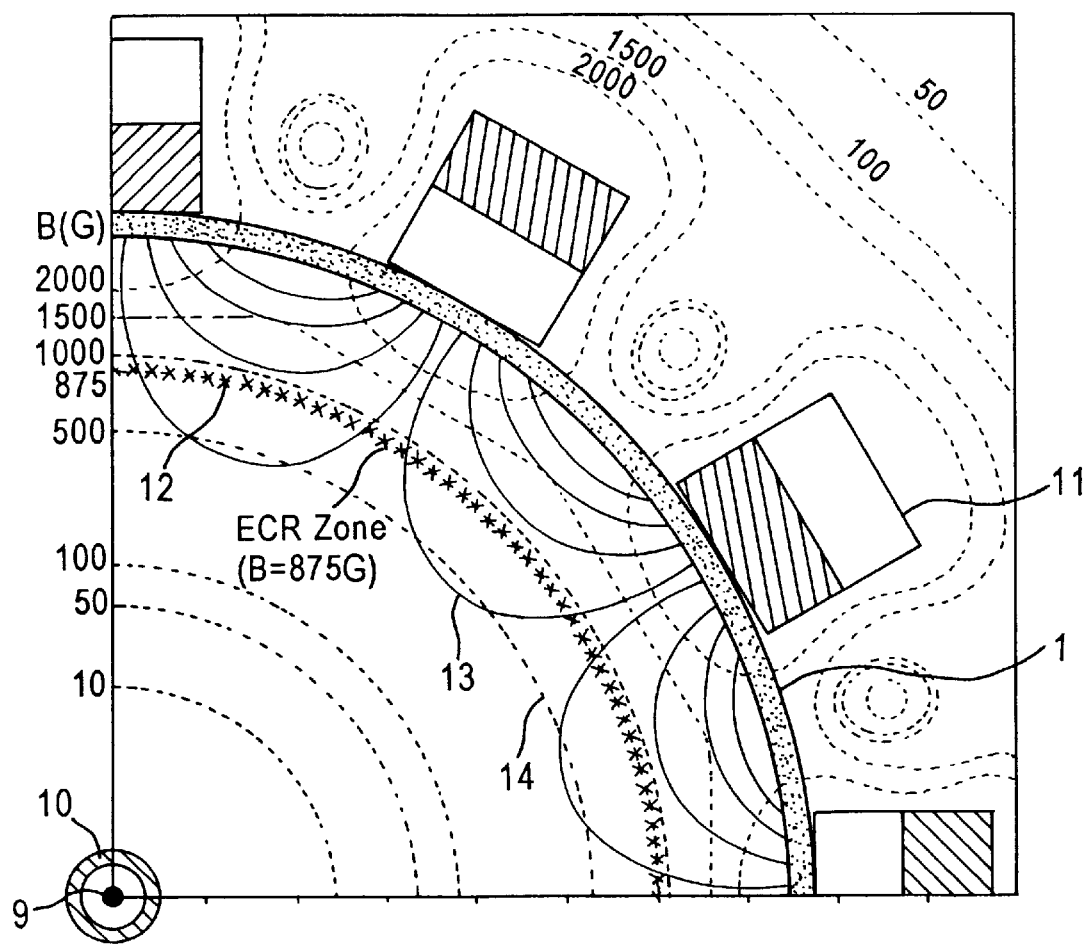
FIG. 3 is a drawing for showing arrangement of the permanent magnets shown in FIG. 2 and a distribution of magnetic field strength generated thereby.

In FIG. 2, the apparatus is constituted by providing permanent magnets 11 around the vacuum vessel 1. FIG. 3 is a quarter of a cross-sectional view of the plasma generating apparatus shown in FIG. 2, wherein arrangement of the permanent magnets with respect to the vacuum vessel and a distribution of magnetic field strength generated by the permanent magnets are shown. In FIG. 3, numeral 13 is a part of magnetic lines of force generated by the permanent magnets 11 and numeral 14 is a part of contour lines of magnetic field strength generated by the permanent magnets 11. Further, the rod antenna 9 and the dielectric tube 10 for introducing the electric power of microwave into the vacuum vessel 1 is located in the central axis of the vacuum vessel 1. It is preferable to set a magnetic field strength of 10 G or less at the part of introducing the microwave (namely, where the rod antenna 9 and the dielectric tube 10 are located).

The permanent magnets 11 attached to the periphery of the vacuum vessel 1 forms a so-called multi-cusp magnetic field in the vicinity of the wall of vacuum vessel 1 as shown in FIG. 3, wherein the permanent magnets 11 works to confine electrons and ions in the plasma 8 in the vacuum vessel 1 by a so-called magnetic mirror effect. Particularly, it is possible to increase the magnetic mirror ratio for electrons and ions generated in a weak magnetic field region at the center portion of the vacuum vessel, therefore the magnetic effect of confining the electrons and the ions is extremely large. By this effect of the magnetic field, it is possible to suppress loss of the plasma caused by a recombination process at the wall surface of vacuum vessel 1 and to generate and maintain the plasma 8 easily. Also the multi-cusp magnetic field formed in the vacuum vessel 1 has an effect of generating more homogeneous plasma 8 in the vacuum vessel 1.

In FIG. 2, since the rod antenna 9 and the dielectric tube 10 for introducing the electric power of microwave into the vacuum vessel 1 are located in a region in a magnetic field of which strength is 10 G or less, it is possible to set the magnetic mirror ratio about 100 with respect to charged particles, such as electrons and ions, generated by the electric power of surface wave which is excited and transmitted at the boundary between the dielectric tube 10 and the plasma 8, whereby the magnetic effect of confining charged particles is extremely large. By the combination of the generation of plasma by the excitation of the surface wave in the region of low magnetic field and the confinement of the plasma by the multi-cusp magnetic field, it is possible to generate the plasma 8 of high density exceeding the cut-off density effectively, even under, for example, a low gas pressure of the order of $10^{-4}$ Torr.

Although, in the example shown in FIG. 2, the rod antenna 9 and the dielectric tube 10 both for introducing the microwave are located in the central axis of the vacuum vessel 1 and the magnetic field strength in this part of introducing the microwave is 10 G or less, it is not always necessary to locate the rod antenna 9 and the dielectric tube 10 along the central axis of the vacuum vessel 1. Further, almost the same effect is obtainable when the microwave is introduced in the region of a weak magnetic field of 100 G or less.

It is possible to form an electron cyclotron resonance region 12 in the vicinity of the inner surface of vacuum vessel 1 by properly selecting the magnetic field strength of permanent magnets 11 shown in FIG. 2. In the vicinity of the electron cyclotron resonance region, the frequency of microwave and the cyclotron frequency of electrons are in conformity with each other, thereby the phenomenon of electron cyclotron resonance, by which electrons are accelerated in terms of resonance by the oscillating electric field of microwave, occurs. Thus, the electron cyclotron resonance discharge occurs easily even under a low gas pressure of $10^{-4}$ Torr or less and the plasma 8 is ignited in the vacuum vessel 1.

When the electric power of introduced microwave is small and the electron density in the plasma 8 is lower than so-called cut-off density of microwave (for example, about $7 \times 10^{10} cm^{-3}$ in case of microwave having a frequency of 2.45 GHz) after the plasma 8 is generated, the microwave introduced into the vacuum vessel 1 through the dielectric tube 10 transmits through the plasma 8 and reaches the electron cyclotron resonance region 12. Thus, the resonant electrons, received energy from the electron cyclotron resonance, work to excite, dissociate and ionize neutral gas particles in the form of atom or in the form of molecule, whereby the generation of plasma 8 is maintained.

Meanwhile, when the electric power of the introduced microwave is large and the electron density in the plasma 8 is higher than the cut-off density, the microwave can exist as a surface wave which transmits along with only the boundary between the dielectric tube 10 and the plasma 8 because the microwave introduced into the vacuum vessel 1 through the dielectric tube 10 can not transmits through the plasma 8. The excited surface wave is transmitted along with the boundary without reflection and the energy of surface wave is absorbed by the plasma 8 during the transmission even in a case of a high-density plasma having an electron density exceeding the cut-off density. Accordingly, the electrons in the vicinity of the surface area of the dielectric tube 10 in the plasma 8 are accelerated by the oscillating electric field of the surface wave; are in a high-energy state; and excite, dissociate and ionize the neutral gas particles in the form of atom or in the form of molecule, whereby the generation of the plasma 8 is maintained.

On the other hand, as the multi-cusp magnetic field, a line-cusp magnetic field as shown in FIG. 3 is generated by the permanent magnets 11. However, any distribution of magnetic field strength which can form the region of weak magnetic field in the central portion of the vacuum vessel 1, to which portion the microwave is introduced, and also can form the region of strong magnetic field in the vicinity of the wall surface of vacuum vessel 1, such as a ring-cusp magnetic field and a hibrid-cusp magnetic field, is applicable.

Figure 8:
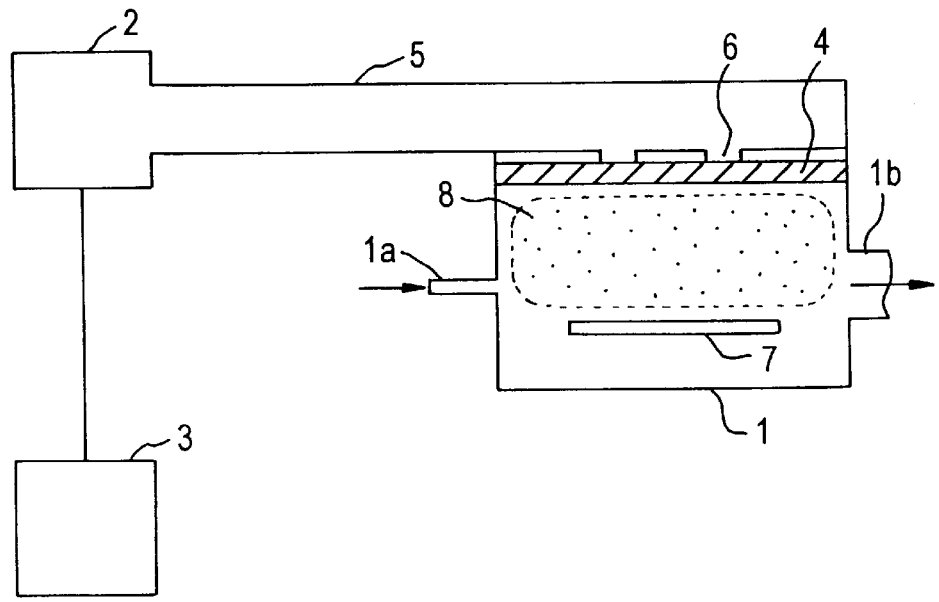
FIG. 8 is a a schematical view for showing the structure of conventional plasma generating apparatus.

In the vacuum vessel 1, besides the multi-cusp magnetic field generated by the permanent magnets 11 as shown in FIG. 3, the electron cyclotron resonance region 12 is also generated. However, if the electron cyclotron resonance region 12 does not exist, ease of firing of the plasma 8 is inferior a little. However, in comparison with the conventional plasma generating apparatus shown in FIG. 8, there is an apparent of homogenizing the distribution of plasma in the vacuum vessel 1.

Figure 4:
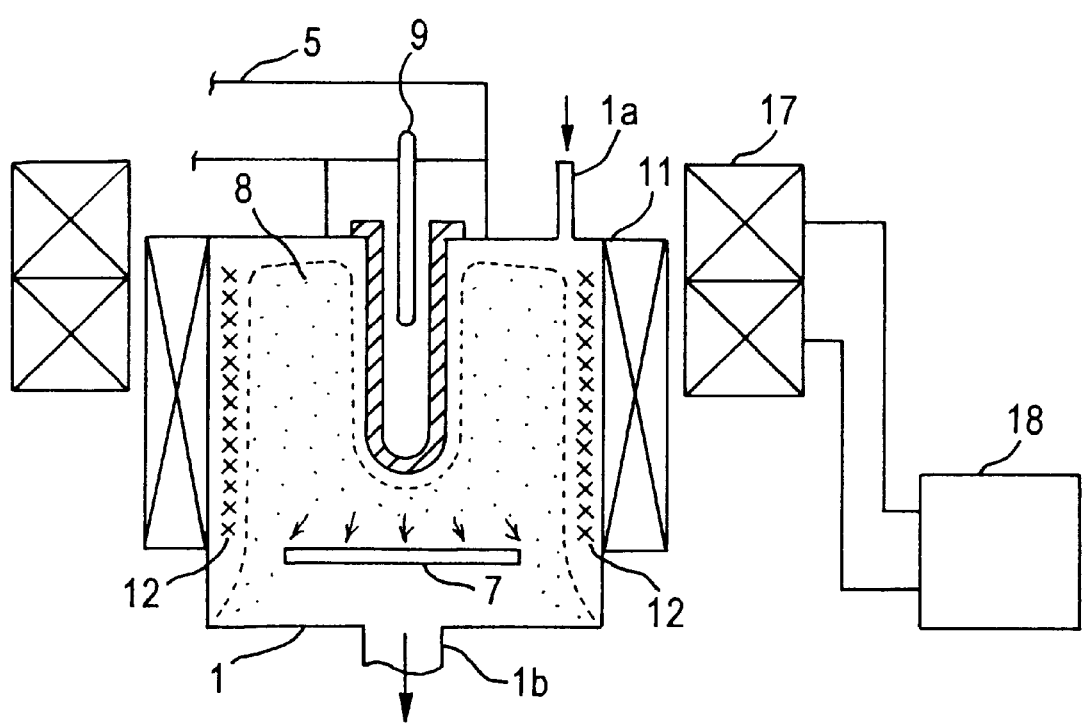
FIG. 4 is a schematical view for showing the structure of another example of the plasma generating apparatus according to the present invention.

Further, in the example, only the multi-cusp magnetic field is generated in the vacuum vessel 1 by the permanent magnets 11 as shown in FIG. 3. A component in the axis direction of vacuum vessel 1 of a magnetic field generated by an electromagnetic coil 17 or the like, which generates a magnetic field by an power supply of coil 18, can be superposed as shown in FIG. 4. In this case, so-called divergent magnetic field is simultaneously generated, whereby the generated plasma 8 is drifted towards the substrate 7. Such a drift motion of plasma 8 is effective for proceeding a surface treatment such as etching, in which incidence of ions in plasma 8 to the substrate 7 is intentionally conducted.

Figure 5:
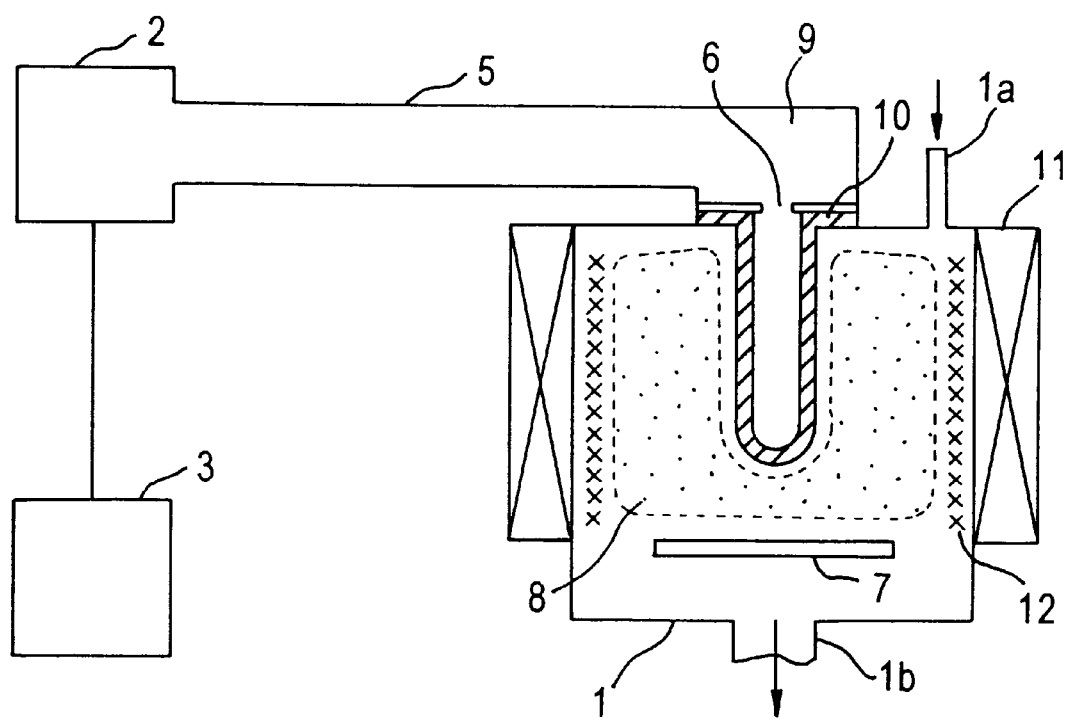
FIG. 5 is a schematical view for showing the structure of another example of the plasma generating apparatus according to the present invention.

In FIGS. 1 and 2, the rod antenna 9 is used to emit microwave to the dielectric tube 10. However, it is not limited to the rod antenna, and any antenna having a structure of emitting microwave, such as a spiral antenna, a helical antenna, a Lisitano coil and a loop antenna, is applicable. When a slit 6 is used as shown in FIG. 5, microwave can be emitted easily.

Figure 6:
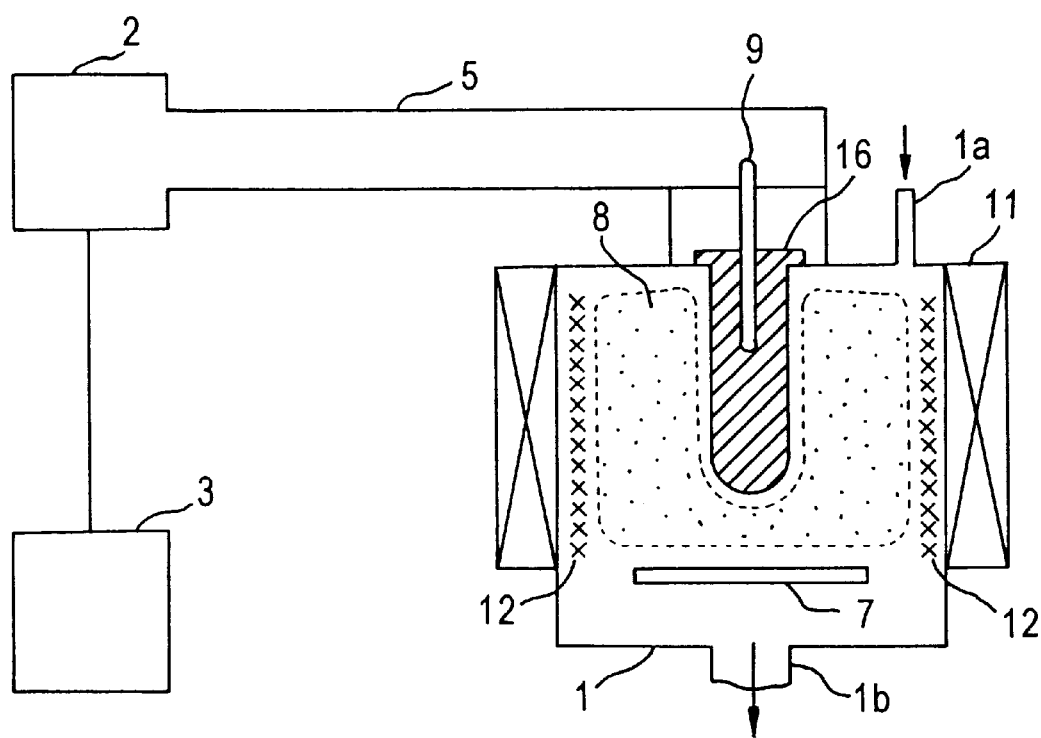
FIG. 6 is a schematical view for showing the structure of another example of the plasma generating apparatus according to the present invention.
Figure 7:
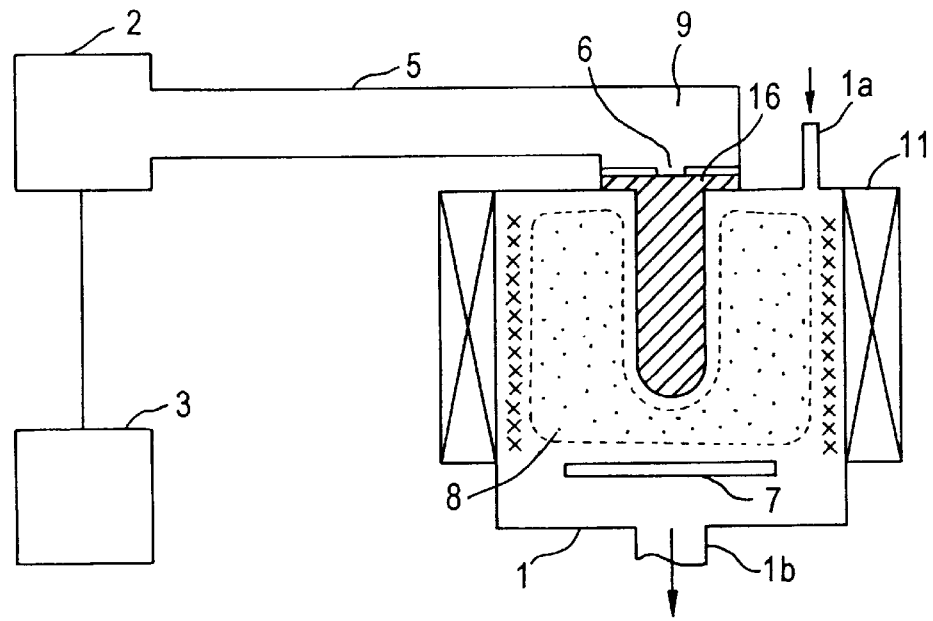
FIG. 7 is a schematical view for showing the structure of another example of the plasma generating apparatus according to the present invention.

Further, although the dielectric tube 10 is used in the above example, a dielectric rod 16 made of a rod-like a dielectric member may be used as shown in FIGS. 6 and 7.

Now, the present invention will be described in detail. According to the first, the third and the fourth aspects of the present invention, it is possible to apply the electric power of microwave effectively to plasma of high density exceeding so-called cut-off density. Further, it is possible to homogenize the distribution of plasma in the vacuum vessel 1.

According to the second and the eighth aspects of the present invention, the magnetic field generated by the plasma generating apparatus has effects of reducing the amount of incident flux of electrons and ions to the wall surface of vacuum vessel enclosing the plasma; of suppressing a loss of plasma caused by recombination at the wall surface; of facilitating the generation and the maintenance of plasma under a low gas pressure; and of improving simultaneously the homogeneity of plasma density.

According to the fifth and the sixth aspects of the present invention, there are effects of effectively applying the electric power of microwave and of obtaining a magnetic effect of confining charged particles extremely firmly, because the magnetic mirror ratio is about 100 with respect to the charged particles, such as electrons and ions, generated by the electric power of the surface wave which is excited and transmitted in the boundary between the dielectric member and the plasma as long as the dielectric member is located in a magnetic field region having a magnetic field strength of 100 G or less.

According to the seventh aspect of the present invention, there is an effect of extremely facilitating the firing of the plasma and the generation of the plasma, because in the electron cyclotron resonance region generated by the plasma generating apparatus, the frequency of a oscillating electric field of microwave and the frequency of a cyclotron motion of electrons are in agreement with each other; the energy of microwave can be applied to the electrons in terms of resonance; and the electrons with a high kinetic energy can easily ionize neutral gas particles.

According to the ninth aspect of the present invention, there is an effect of effectively performing surface treatment such as etching because so-called divergent magnetic field is formed simultaneously by providing an additional electromagnetic coil; the generated plasma is moved by a drift motion toward an object to be treated; and incidence of ions in the plasma into the object to be treated is positively performed by the drift motion of plasma.

What is claimed is:

1. A plasma generating apparatus comprising:

a waveguide for guiding microwaves;

a vacuum vessel connected to the waveguide, having a means for supplying a gas to the vacuum vessel for discharging electrons and a means for evacuating the vacuum vessel;

a dielectric member having a tube-like shape or a rod-like shape, extending into the vacuum vessel, and comprising means for emitting microwaves; and means, disposed outside of the vacuum vessel, for generating a first magnetic field inside the vacuum vessel such that the dielectric member is in a relatively weak magnetic field region of the first magnetic field.

2. The plasma generating apparatus according to claim 1, wherein the means for emitting microwaves is a slit or an antenna provided in a wall of the waveguide.

3. The plasma generating apparatus according to claim 1, wherein the dielectric member comprises a dielectric material through which microwaves are permeable.

4. The plasma generating apparatus according to claim 1, wherein the dielectric member is located in a weak magnetic field region having a magnetic field strength of 100 G or less.

5. The plasma generating apparatus according to claim 1, wherein the weak magnetic field region has a magnetic field strength of 100 G or less.

6. The plasma generating apparatus according to claim 1, wherein the first magnetic field has a magnetic field strength sufficient to cause an electron cyclotron resonance and to start a discharge using the electron cyclotron resonance.

7. The plasma generating apparatus according to claim 1, wherein the means for generating a magnetic field is a permanent magnet.

8. The plasma generating apparatus according to claim 1, further comprising an electromagnetic coil for generating a component of a second magnetic field to be superposed on a component of the first magnetic field, the electromagnetic coil being disposed outside of the vacuum vessel.

9. The plasma generating apparatus according to claim 3, wherein the dielectric member comprises at least one of quartz, glass, polytetrafluoroethylene and ceramic.

* * * * *